United States Patent
Tanaka et al.

(10) Patent No.: US 7,515,342 B2
(45) Date of Patent: Apr. 7, 2009

(54) SOLID-STATE IMAGING DEVICE EQUIPPED WITH LIGHT CONVERGING MICRO-LENSES AND CAMERA APPARATUS USING THE SAME

(75) Inventors: Nagataka Tanaka, Yokohama (JP); Masatoki Nakabayashi, Kawasaki (JP); Kenichi Nakamura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/776,372

(22) Filed: Jul. 11, 2007

(65) Prior Publication Data
US 2007/0252909 A1 Nov. 1, 2007

Related U.S. Application Data

(62) Division of application No. 11/358,410, filed on Feb. 22, 2006.

(30) Foreign Application Priority Data

Feb. 23, 2005 (JP) ............................. 2005-047460

(51) Int. Cl.
*G02B 27/10* (2006.01)
*H04N 5/225* (2006.01)
(52) U.S. Cl. ..................................... 359/619; 348/340
(58) Field of Classification Search ......... 359/619–623; 348/340, 251, 252, 241–242; 250/208.1

See application file for complete search history.

(56) References Cited

U.S. PATENT DOCUMENTS

| | | | |
|---|---|---|---|
| 5,489,940 A * | 2/1996 | Richardson et al. | ......... 348/315 |
| 5,682,203 A | 10/1997 | Kato | |
| 6,690,049 B2 | 2/2004 | Suzuki et al. | |
| 7,282,686 B2 * | 10/2007 | Ahn | ....................... 250/208.1 |
| 2001/0026322 A1 | 10/2001 | Takahashi et al. | |

FOREIGN PATENT DOCUMENTS

JP 2004-228645 8/2004

OTHER PUBLICATIONS

Toshinobu Ogura, "Shashin Renzu No Kiso To Hatten," Asahi Sonorama, ISBN 4-257-12012-6, 1995, pp. 44-45 and cover page.

* cited by examiner

*Primary Examiner*—Alicia M Harrington
(74) *Attorney, Agent, or Firm*—Oblon, Spivak, McClelland, Maier & Neustadt, P.C.

(57) ABSTRACT

A solid-state imaging device includes a plurality of photo receivers arranged in a two-dimensional array on a semiconductor substrate, the photo receivers receiving exit light from an imaging optical system; and a plurality of condensing lenses arranged over the said plurality of photo receivers, respectively. At least either the plurality of condensing lenses or the plurality of photo receivers are arranged at smaller pitches where an absolute value of an exit pupil position in the imaging optical system is large and at greater pitches where the absolute value of the exit pupil position is small.

7 Claims, 8 Drawing Sheets

SOLID-STATE IMAGING DEVICE EQUIPPED WITH LIGHT CONVERGING MICRO-LENSES AND CAMERA APPARATUS USING THE SAME

CROSS-REFERENCE TO RELATED APPLICATIONS

This application is a Division of and claims the benefit of priority under 35 U.S.C. §120 from U.S. Ser. No. 11/358,410 filed Feb. 22, 2006, and claims the benefit of priority under 35 U.S.C. §119 from Japanese Patent Application No. 2005-047460 filed Feb. 23, 2005, the entire contents of each of which are incorporated herein by reference.

BACKGROUND OF THE INVENTION

1. Field of the Invention

The present invention relates to a solid-state imaging device and a camera apparatus using the same. More specifically, the invention relates to a miniature camera including an image sensor of charge coupled device (CCD) type or complementary metal oxide semiconductor (CMOS) type and commonly built in a mobile telephone or the like.

2. Description of the Related Art

Conventionally, CCD type and CMOS type image sensors (solid-state imaging devices) have widely been employed as miniature cameras built in, for example, mobile telephones. Such an image sensor is known including a plurality of photodiodes, each photodiode has a light converging micro-lens provided on the light incident side thereof for increasing the efficiency of photo detection in an image area.

An incidence angle of light incident on each photodiode after emitted from a camera lens (imaging optical system) is different between the center and the edge of the imaging area. For this reason, the edge of the imaging area (particularly at each of the four corners in case of an area sensor) is lower in the photosensitivity (the efficiency of photo detection) than the center of the imaging area when the micro-lenses and the photodiodes are arranged at equal pitches, i.e., when the photodiodes are aligned with the corresponding micro-lenses in position. This is because there is employed, as the camera lens, a lens having a lens characteristic according to so-called paraxial ray approximation substantially expressed by $z/p=\tan\theta=\theta$, where $\theta$ is an exit angle of chief-ray from a final plane of an optical system; $z$ is an image height; and $e$ is an exit pupil position, while the exit pupil position hardly depends on the image height $z$. Meanwhile, the $p$ represents an array pitch of the photodiodes.

Upon usage of the camera lens having a lens characteristic according to paraxial ray approximation, the micro-lenses are arranged such that array pitches of the micro-lenses are equally smaller than those of the photodiodes, so that the greater the image height (departing outwardly toward the edge from the center of the imaging area), the greater the dislocation between the photodiode and the micro-lens increases. Namely, the light is made to be obliquely incident on the photodiodes at the edge of the imaging area. Thus, the position of each micro-lens with respect to the position of the corresponding photo diode is gradually offset in the direction of the center as it shifts from the center to the edge of the imaging area. This allows the efficiency of light concentration to be improved over the photodiodes at the edge. Accordingly, the shading at the edge of the imaging area can be corrected, thus ensuring substantially an uniform level of the photosensitivity throughout the imaging area.

As camera lenses have recently been thinned and minimized in overall dimensions, many camera lenses having a lens characteristic deviated from the paraxial ray approximation (such as plastic lenses) have been used. Suppose a case of using, for example, a camera lens having a lens characteristic largely deviated from the paraxial ray approximation such that an exit angle of chief-ray increases as the image height becomes greater and then, the exit angle of chief-ray decreases. In this case, the photosensitivity at the edge of the imaging area is lowered in the case where the micro-lenses are arranged so as to be largely displaced from the photodiodes as shifting from the center of the imaging area.

With the use of an imaging optical system where the exit angle of chief-ray from the final plane of the optical system is not continuously increased as the image height from the optical axis becomes greater, the array pitch of the micro-lenses in the solid-state imaging device is decreased at least at a region between the center and a predetermined position of the edge of the imaging area and is increased at least at a region of the edge exceeding the predetermined position than the array pitch at the predetermined position. Accordingly, the correction of shading at the edge of the imaging area can be suppressed. Such an attempt has been disclosed in the prior art (see, for example, Jpn. Pat. Appln. KOKAI Publication No. 2004-228645).

However, the foregoing attempt permits a plurality of micro-lenses to be arranged at different pitches which are decreased at least at a region between the center and a predetermined position of the edge of the imaging area. When another imaging optical system is used where the exit angle of chief-ray from the final plane of the optical system is increased until the image height rises up to a specific level from the optical axis and then decreased after the specific level of the image height, the correction of shading can hardly be attenuated.

In brief, even when the imaging optical system is used where the exit angle of chief-ray from the final plane of the optical system is increased until the image height rises up to a specific level from the optical axis and then decreased after the specific level of the image height, the paraxial ray approximation is substantially established at a region where the image height is close to zero. Accordingly, the efficiency of light concentration can be ensured when the array pitches of the micro-lenses are substantially equally set smaller than the array pitches of the photodiodes. In contrast, when the micro-lenses are arranged at decremental pitches at least at a region between the zero point and the intermediate point of the image height, the photosensitivity is declined. As a result, the efficiency of light concentration can hardly be maintained throughout the imaging area.

BRIEF SUMMARY OF THE INVENTION

According to a first aspect of the present invention, there is provided a solid-state imaging device comprising: a plurality of photo receivers arranged in a two-dimensional array on a semiconductor substrate, the photo receivers receiving exit light from an imaging optical system; and a plurality of condensing lenses arranged over the said plurality of photo receivers, respectively, wherein at least either said plurality of condensing lenses or said plurality of photo receivers are arranged at smaller pitches where an absolute value of an exit pupil position in the imaging optical system is large and at greater pitches where the absolute value of the exit pupil position is small.

According to a second aspect of the present invention, there is provided a camera apparatus comprising: a solid-state imaging device including a plurality of photo receivers arranged in a two-dimensional array on a semiconductor substrate and a plurality of condensing lenses arranged over said plurality of photo receivers, respectively; and an imaging optical system which emits incident light received on said plurality of photo receivers via said plurality of condensing lenses, respectively, wherein at least either said plurality of condensing lenses or said plurality of photo receivers are arranged at smaller pitches where an absolute value of an exit pupil position in the imaging optical system is large and at greater pitches where the absolute value of the exit pupil position is small.

DETAILED DESCRIPTION OF THE INVENTION

Embodiments of the present invention will be described in mode detail with reference to the accompanying drawings. It should be noted that the drawings are illustrative where the dimensions, ratios and the like represent no actual measurements. As a matter of course, there are no relationship in the dimensions and ratios between the drawings.

First Embodiment

Figure 1A:
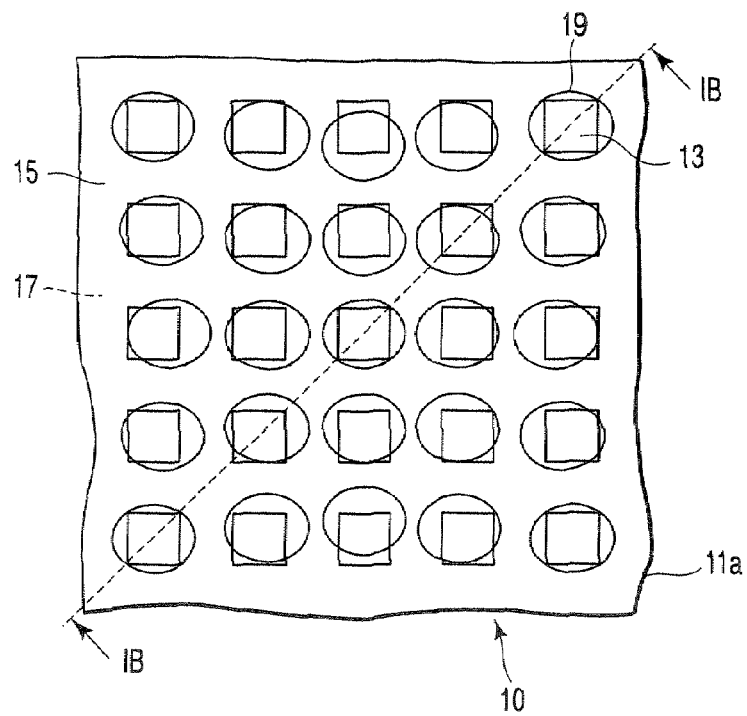
FIGS. 1A and 1B are views each showing an arrangement example of a CMOS image sensor according to a first embodiment of the present invention.
Figure 1B:
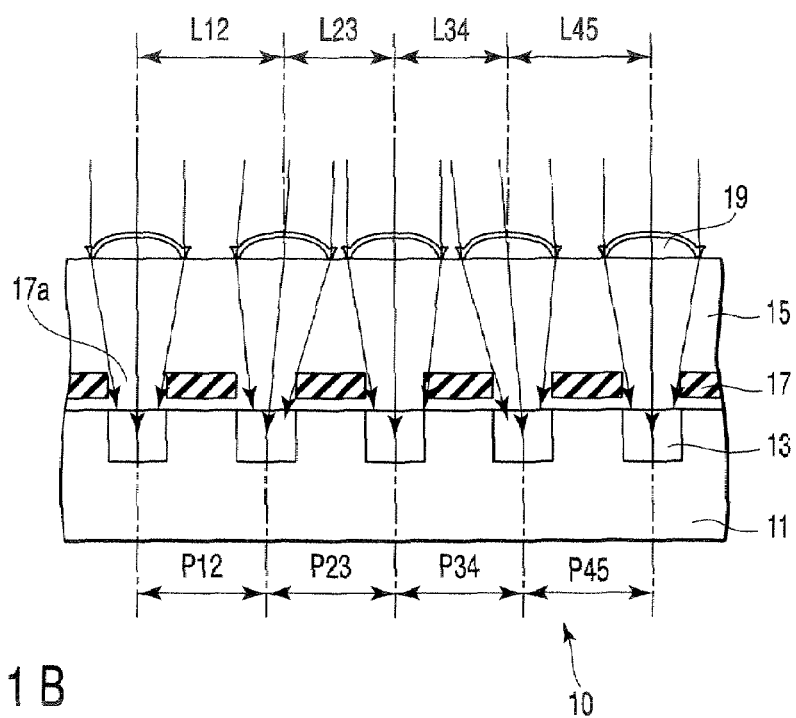

FIGS. 1A and 1B illustrate a basic configuration of a CMOS image sensor (solid-state imaging device) 10 according to a first embodiment of the present invention. FIG. 1A is a plan view of an imaging area provided to the image sensor, and FIG. 1B is a cross sectional view taken along the line IB-IB of FIG. 1A. The embodiment describes, as an example, a CMOS area sensor for used in a miniature camera built in a mobile telephone or the like. The embodiment explains a case of improving (attenuating) the shading characteristic in such a manner that, upon usage of a ca era lens (imaging optical system) having a lens characteristic deviated from the paraxial ray approximation, a scaling amount of micro-lenses (light concentrating lenses) is modified (referred to as array pitch hereinafter) depending on the position of pixels in the imaging area, and the light emitted from a final plane of the camera lens can be incident at higher efficiency on each photodiode (photo-receiver) in every regions of the imaging area, thereby preventing decline in the photosensitivity at, particularly, an intermediate region between the center and the edge of the imaging area.

As shown in FIGS. 1A and 1B, an imaging area 11a is formed on the upper surface of a semiconductor substrate 11. A plurality of photodiodes 13 are arranged in a two-dimensional array on the imaging area 11a. The plurality of photodiodes 13 in this embodiment are arranged at equal pitches P (P12=P23=P34=P45).

A light transmissive film 15 having a uniform thickness is provided on the upper surface of the semiconductor substrate 11. The light transmissive film 15 has provided thereon a light shielding film 17 for controlling the entrance of light into the photodiodes 13. The light shielding film 17 has apertures 17a in response to the positions of the photodiodes 13. More specifically, the apertures 17a in the light shielding film 17 are substantially identical in the position to the photodiodes 13.

Micro-lenses 19 are provided on the upper surface of the light transmissive film 15 so as to correspond to the respective photodiodes 13. The micro-lenses 19 are arrayed in the image area 11a at different pitches L in this embodiment. For example, the array pitches L of the micro-lenses 19 are smaller than the array pitch P of the photodiodes 13 at the center of the imaging area 11a, and the array pitches L of the micro-lenses 19 are greater than the array pitch P of the photodiodes 13 at the edge of imaging area 11a (L12=L45>L23=L34, and L12=L45>P12=P23=P34=P45>L23=L34).

Figure 2:
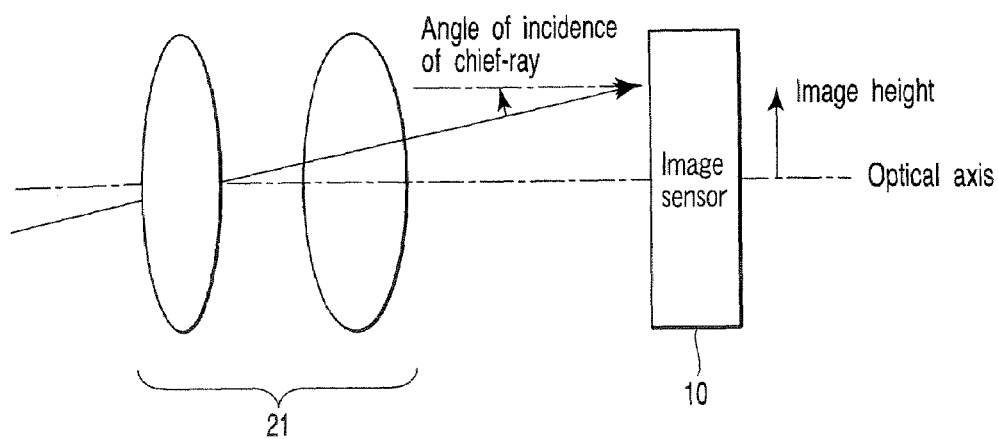
FIG. 2 is a view showing the relationship between a camera lens and the image sensor shown in FIGS. 1A and 1B.

FIG. 2 illustrates the relationship between the CMOS image sensor 10 having the above configuration and a camera lens 21. The light emitted from a final plane of the camera lens 21 is made to be incident to the photodiodes 13 on the image sensor 10 depending on the angles of incidence of chief-ray according to the position of pixel, where images of different image heights corresponding to the angles of incidence of chief-ray are formed (light is received).

The term "chief-ray" refers to a center beam of a flux of light to be focused at a certain point, and the term "image height" refers to a distance from the optical axis on an imaging plane. In the embodiment of the present invention, an exit pupil position is defined by the following condition. That is, when the angle of incidence of chief-ray is θ at the position of the image height z, the exit pupil position e(z) at the image height z is defined by tan θ=z/e(z).

Figure 3:
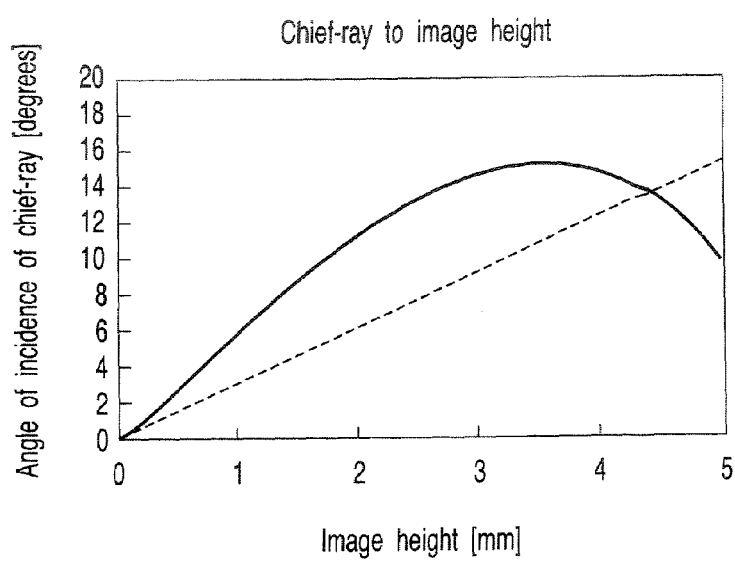
FIG. 3 is a graph for explaining a lens characteristic of the camera lens (between the angle of incidence of chief-ray and the image height)

FIG. 3 shows a lens characteristic of the camera lens 21 (the relationship between the angle of incidence of chief-ray and the image height). As the camera lens 21 is made of a plastic material for down-sizing or thickness-reduction, its exit angle (equal to the angle of incidence on the image sensor) becomes greater along the image height being increased. The exit angle of the camera lens 21 is increased at a uniform rate to a level of the image height (around 3.5 mm in this embodiment) from the optical axis and then declined gradually.

As described above, the camera lens 21 has a lens characteristic significantly deviated from the conventional paraxial ray approximation (denoted by the broken line in FIG. 3). When such a camera lens 21 not conforming to the paraxial ray approximation is used as the imaging optical system, its angle of incidence of chief-ray towards the micro-lenses 19 becomes close to zero in the vicinity of the center and the edge of the imaging area 11*a* as shown in FIG. 1B. However, in the intermediate region between the center and the edge of the imaging area 11*a*, the angle of incidence of chief-ray towards the micro-lenses 19 is increased monotonously.

Consequently, the array pitches L of the micro-lenses 19 are set greater than the array pitch P of the photodiodes 13 at the edge of the imaging area 11*a*, so that the micro-lenses 19 are substantially aligned with the corresponding photodiodes 13. As a result, even in combination with the camera lens 21 having such a lens characteristic as denoted by the real line in FIG. 3, the exit light from the camera lens 21 can remain not interrupted by the shielding film 17 at the edge (particularly at four corners) of the imaging area 11*a*, thus ensuring the sufficient photosensitivity (the efficiency of photo detection).

In the intermediate region between the center and the edge of the imaging area 11*a*, the array pitches L of the micro-lenses 19 are set smaller than the array pitch P of the photodiodes 13. This allows the micro-lenses 19 to be positioned inwardly of the photodiodes 13 (towards the center). As a result, even in combination with the camera lens 21 with the lens characteristic denoted by the real line in FIG. 3, the exit light from the camera lens 21 can remain not interrupted by the shielding film 17 at the intermediate region between the center and the edge of the imaging area 11*a* but received efficiently.

In other words, the array pitches L of the micro-lenses 19 are not uniform in the imaging area 11*a*. More specifically, the array pitches L of the micro-lenses 19 are smaller than the array pitch P of the photodiodes 13 at the center of the imaging area 11*a* (where the absolute value of the exit pupil position is greater) and greater than the array pitch P of the photodiodes 13 at the edge of the imaging area 11*a* (where the absolute value of the exit pupil position is smaller). Accordingly, the photodiodes 13 can be improved in the photosensitivity throughout the imaging area 11*a*.

A method for optimizing array pitches of the micro-lenses 19 in relation to the corresponding photodiodes 13 will now be described in more detail in case of using the camera lens 21 having the lens characteristic denoted by the real line in FIG. 3.

Figure 4:
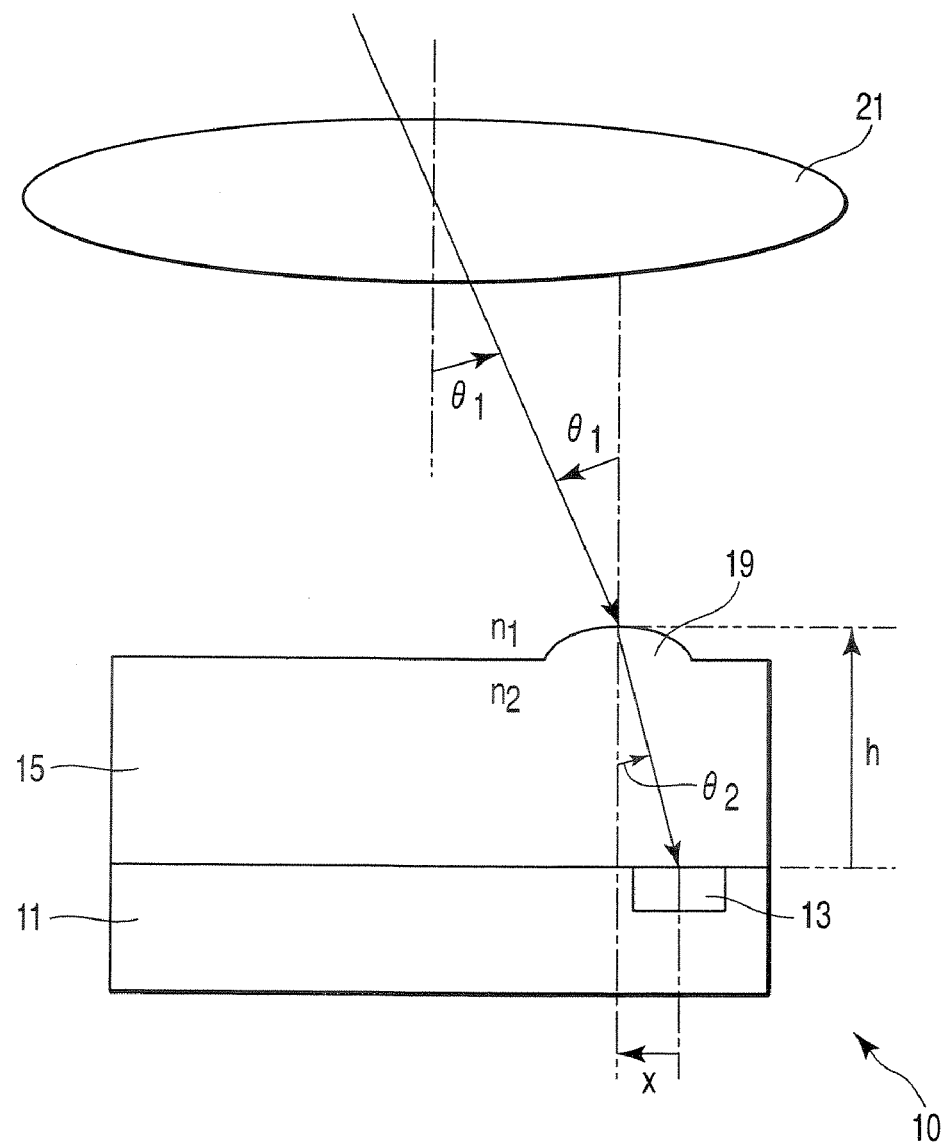
FIG. 4 is a view showing a method for optimizing a scaling amount of a micro-lens.

FIG. 4 is a view illustrating the method for optimizing the array pitches of the micro-lenses. Explanation will be made for a case of optimizing the positional relationship between the photodiode and the micro-lens at a pixel spaced from the center of the imaging area (or the camera lens).

Assuming as shown in FIG. 4 that the light emitted at an exit angle $\theta_1$ from the camera lens 21 is incident to the micro-lens 19 (at an angle of incidence $\theta_2$) having an index of refraction of $n_2$, the following formula 1 is established according to the Snell's law of refraction:

$$n_1 \sin\theta_1 = n_2 \sin\theta_2$$

$$\theta_2 = \sin^{-1}\left(\frac{n_1 \sin\theta_1}{n_2}\right)$$

where $n_1$ is the index of refraction of air.

Also, the displacement x between the micro-lens 19 and the photodiode 13 is calculated from the following formula 2:

$$x = h\tan\theta_2$$

$$= h\tan\left(\sin^{-1}\left(\frac{n_1 \sin\theta_1}{n_2}\right)\right)$$

When the micro-lens 19 is dislocated by the amount shown in the following formula 3 from the photodiode 13, it allows the light having passed through the center of the micro-lens 19 to be incident to the center of the photodiode 13, thereby theoretically permitting no declination in the photosensitivity.

$$h\tan\left(\sin^{-1}\left(\frac{n_1 \sin\theta_1}{n_2}\right)\right)$$

Assuming that the shift amount of the micro-lens 19 from its corresponding photodiode 13 at the nth pixel from the center of the imaging area 11*a* is x(n) (in this case, when the photodiode 13 is displaced to and from the center, its displacement is positive and negative respectively), it has been found that the layout design so as to satisfy the following formula 4 is optimum in optical design.

$$x(n) = h\tan\left(\sin^{-1}\left(\frac{n_1 \sin\theta_1(pn)}{n_2}\right)\right)$$

where p is the array pitch (pixel pitch) of the photodiodes 13, and has a relationship of z=np (z being the image height).

Next, the pixel pitch is determined. First, a value pm(n) of the array pitch of the micro-lens 19 at the nth pixel from the center of the imaging area 11*a* is calculated from the following formula (5):

$$p_m(n) = p - (x(n+1) - x(n)) \approx p - \frac{\partial x(n)}{\partial n}$$

When x(n) optimized by the above formula 4 is assigned to the formula 5, the value pm(n) of the array pitch of the micro-lens 19 is expressed by the following formula (6):

$$p_m(n) = p - \frac{\partial x(n)}{\partial n}$$

-continued $$= p - h\sec^2\left(\sin^{-1}\left(\frac{n_1\sin\theta_1(np)}{n_2}\right)\right)\frac{1}{\sqrt{1-\left(\frac{n_1\sin\theta_1(z)}{n_2}\right)^2}}\frac{n_1}{n_2}\cos\theta_1(np)\frac{\partial\theta_1(np)}{\partial n}$$

Consequently, it has been found that the arrangement of the micro-lens 19 at the nth pixel from the center of the imaging area 11a according to the formula (6) is optimum in optical design.

For examining the value pm(n) of the array pitch of the micro-lens 19, the above formula 6 is differentiated with n. Then, the result is expressed by the following formula (7):

$$\frac{p_m(n)}{\partial n} = \frac{\partial}{\partial n}\left(-h\frac{n_1}{n_2}\sec^2\left(\sin^{-1}\left(\frac{n_1\sin\theta_1(np)}{n_2}\right)\right)\frac{1}{\sqrt{1-\left(\frac{n_1\sin\theta_1(np)}{n_2}\right)^2}}\cos\theta_1(np)\frac{\partial\theta_1(np)}{\partial n}\right)$$

$$= 2h\frac{n_1}{n_2}\sec^3\left(\sin^{-1}\left(\frac{n_1\sin\theta_1(np)}{n_2}\right)\right)\frac{n_1\sin\theta_1(np)}{n_2}\frac{1}{\sqrt{1-\left(\frac{n_1\sin\theta_1(np)}{n_2}\right)^2}}\cos\theta_1(np)\frac{\partial\theta_1(np)}{\partial n} +$$

$$\frac{h}{2}\frac{n_1}{n_2}\sec^2\left(\sin^{-1}\left(\frac{n_1\sin\theta_1(np)}{n_2}\right)\right)\left(1-\left(\frac{n_1\sin\theta_1(np)}{n_2}\right)^2\right)^{-\frac{3}{2}}\cos\theta_1(np)\frac{\partial\theta_1(np)}{\partial n} +$$

$$h\frac{n_1}{n_2}\sec^2\left(\sin^{-1}\left(\frac{n_1\sin\theta_1(np)}{n_2}\right)\right)\frac{1}{\sqrt{1-\left(\frac{n_1\sin\theta_1(np)}{n_2}\right)^2}}\sin\theta_1(np)\frac{\partial\theta_1(np)}{\partial n} -$$

$$h\frac{n_1}{n_2}\sec^2\left(\sin^{-1}\left(\frac{n_1\sin\theta_1(np)}{n_2}\right)\right)\frac{1}{\sqrt{1-\left(\frac{n_1\sin\theta_1(np)}{n_2}\right)^2}}\cos\theta_1(np)\frac{\partial^2\theta_1(np)}{\partial n^2}$$

When the image height is about 0 mm, the above formula 7 approximates to the following formula 8.

$\theta_1(np)\cong 0$, $\sin\theta_1(np)\cong 0$, $\cos\theta_1(np)\cong\sec\theta_1(np)\cong 1$ Then, the above formula 7 is expressed by the following formula (9):

$$\frac{p_m(n)}{\partial n} = -h\frac{n_1}{n_2}\frac{\partial^2\theta_1(np)}{\partial n^2}$$

In case of the camera lens satisfying the following formula (10), the value pm(n) of the array pitch of the micro-lenses 19 is a monotonously increasing function for the image height of about 0 mm.

$$\frac{\partial^2\theta_1(np)}{\partial n^2} < 0$$

It has been then found that this embodiment is more advantageous in optical design of pitch arrangement than the prior art (disclosed in Jpn. Pat. Appln. KOKAI Publication No. 2004-228645) where the array pitches of micro-lenses are decrementally varied about 0 mm of the image height.

In an actual camera lens, the above formula (10) is often established. For example, the known report about such a camera lens, "Basic and development of photographic lenses" by Toshinori Ogura, Asahi Sonorama, 1995, describes that flux of light to fall on a film is projected as if departing from the exit pupil, which is an aperture image viewed from the rear side of the lens, and focused on an imaging point.

In case of using the camera lens (where the exit pupil position remains constant regardless of the image height) having a lens characteristic conforming to the above report, the relationship among the angle of incidence $\theta_1$, the exit pupil position e, and the image height z is expressed by the following formula (11):

$$z = e\tan\theta$$

$$\theta = \tan^{-1}\left(\frac{z}{e}\right) = \tan^{-1}\left(\frac{np}{e}\right)$$

Then, the following formula (12) is established.

$$\frac{\partial^2\theta_1(np)}{\partial n^2} = \frac{\partial}{\partial n}\frac{\partial\theta_1(np)}{\partial n}$$

$$= \frac{p}{e}\frac{\partial}{\partial n}\frac{1}{1+\left(\frac{np}{e}\right)^2}$$

$$= \frac{p}{e}\frac{\partial}{\partial n}\frac{1}{1+\left(\frac{np}{e}\right)^2}$$

$$= -2n\left(\frac{p}{e}\right)^3\left(\frac{1}{1+\left(\frac{np}{e}\right)^2}\right)^2$$

As understood, the above formula (12) always represents a negative value. It is thus apparent from the formula (12) that the optimizing method of this embodiment is highly effective Although the foregoing description concerns the specific configuration for ease of the understanding, its actual optimizing process incorporates the following steps.

<1> Check the specifications (the angle of incidence $\theta_1$ from the cameral lens 21, the thickness of the light transmissive film 15 (the height h), the index of refraction $n_2$, and so on).

<2> Calculate the displacement x between the position of incident light received by the micro-lens 19 and the position of incident light projected on the imaging plane of the corresponding photodiode 13 by optical calculation.

<3> Shift the position of the micro-lens 19 by the displacement x calculated in the step <2>.

<4> Subject the shift amount calculated by the step <3> to a differential operation to calculate the value pm(n) of the array pitch of the micro-lens 19.

The array pitches L of the micro-lenses 19 are not strictly set to the value pm(n) obtained by the above optimizing method. The array pitches L may be set in consideration of economical effects without departing from the scope of the present invention. In this case, it is necessary that the photosensitivity is determined with an optical simulator by using the value pm(n) of the array pitches L of the micro-lenses 19, thereby confirming that no significant drop in the photosensitivity is measured.

Particularly when the overall configuration becomes complex, for example, a plurality of light transmissive films exist which are different in the index of refraction, the optical calculation based on the teaching of the present invention is actually conducted. Using the displacement x calculated by the optical calculation, the array pitches L of the micro-lenses 19 may finally be determined.

The specific design and photosensitivity calculation of the array pitches of the micro-lenses will be described in more detail. It is now assumed that the array pitch of the photodiodes 13 is fixed to 5 μm with the camera lens 21 having such a lens characteristic as denoted by the real line in FIG. 3.

Figure 5A:
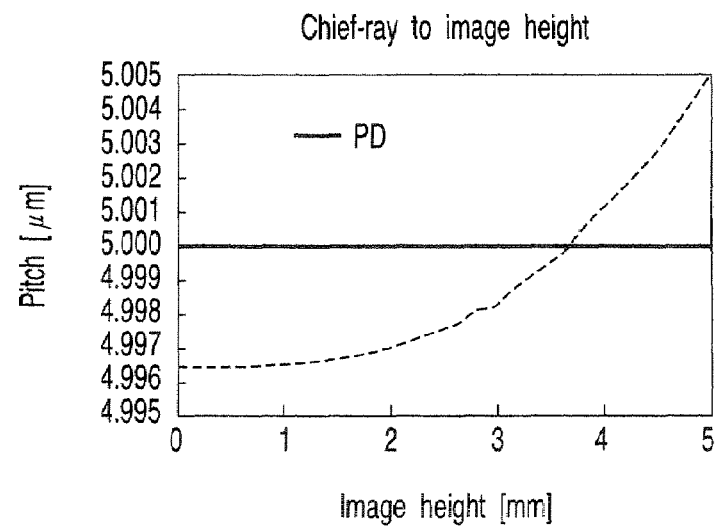
FIGS. 5A and 5B are graphs illustrating results of the optimum array pitch of the micro-lenses and a displacement amount of the micro-lens from its corresponding photodiode calculated by the optimizing method.
Figure 5B:
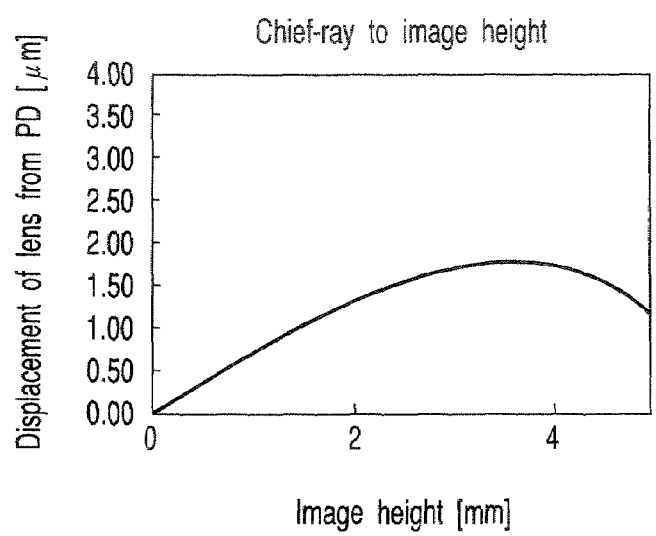

FIGS. 5A and 5B illustrates results (optimum design value) of actual calculation of the optimum array pitch L of the micro-lens 13 and the displacement x of the micro-lens 13 from the corresponding photodiode (PD) 13 by the optimizing method described above. The profile is based on the configuration shown in FIG. 4 where the indices of refraction $n_1$ and $n_2$ are 1.0 and 1.5 respectively while the height h is 10 μm. The profile shown in FIG. 5A represents the relationship between the image height and the array pitch L of the micro-lens 19. The profile shown in FIG. 5B represents the relationship between the image height and the displacement x of the micro-lens 19.

As apparent from FIG. 5A, the array pitch P of the photodiode 13 is uniform (5 μm in this embodiment) regardless of the image height. The array pitch L of the micro-lens 19 is approximately 4.9964 μm where the image height is 0 mm and monotonously increased to about 5.005 μm at the image height of 5 mm.

As shown in FIG. 5B, the displacement x of the micro-lens 19 from the corresponding photodiode 13 is 0 μm where the image height is 0 mm. The displacement x is then increased to the maximum (about 1.85 μm) where the image height is about 3.5 mm (70% in percentage calculated from 3.5/5.0). As the image height further increases, the displacement x starts being declined and is finally minimized to about 1.2 μm where the image height is 5 mm.

In this embodiment, the image sensor 10 shown in FIGS. 1A and 1B is fabricated with the obtained optimum design value. More specifically, when the image height is 0 mm or the absolute value of the exit pupil position is greater, the array pitch L of the micro-lens 19 stays at approximately 4.9964 μm as denoted by the broken line in FIG. 5A, which is smaller than the array pitch P of the photodiode 13. When the image height is 5 mm or the absolute value of the exit pupil position is smaller, the array pitch L of the micro-lens 19 is increased to approximately 5.005 μm which is greater than the array pitch P of the photodiode 13.

FIGS. 6A and 6B and FIGS. 7A and 7B illustrate comparisons in both the optimum array pitch L of the micro-lens 19 and the displacement x of the micro-lens 19 from its corresponding photodiode 13 between the settings of this embodiment and the settings of the prior art where the array pitch L of the micro-lens 19 is decreased when the image height is low and increased when the same is high.

Figure 6A:
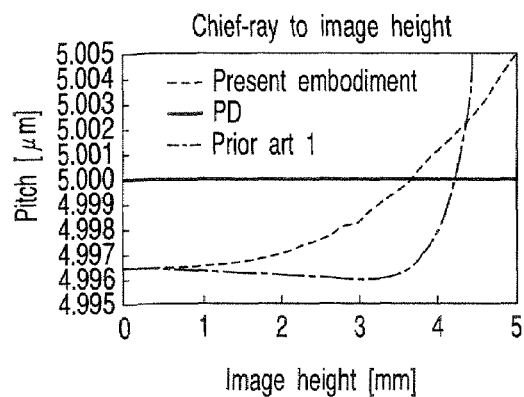
FIGS. 6A and 6B are graphs illustrating comparison between the results shown in FIGS. 5A and 5B and calculated by the optimizing method and those of a prior art (Prior art 1)
Figure 6B:
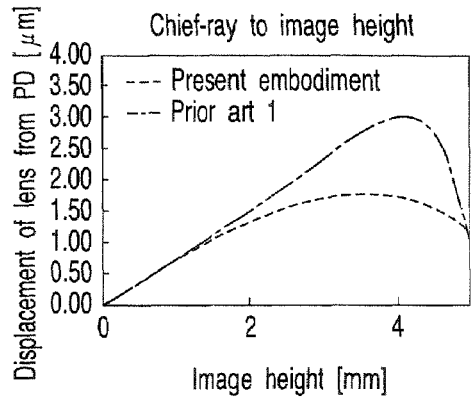

The array pitch in Prior art 1 shown in FIG. 6A is equal to the optimum design value of this embodiment where the image height is approximately 0 mm. As the image height increases, the array pitch becomes smaller. For example, as shown in FIG. 6B, the displacement x of the micro-lens from the photodiode in Prior art 1 is close to the optimum design value of this embodiment where the image height is approximately 0 mm. As the image height increases, the discrepancy in the displacement becomes great. When the image height is about 3.5 mm, the displacement in Prior art 1 is deviated by approximately 1 μm from the optimum design value of this embodiment. Finally, when the image height increases to about 5 mm, the displacement becomes similar to the optimum design value.

Figure 7A:
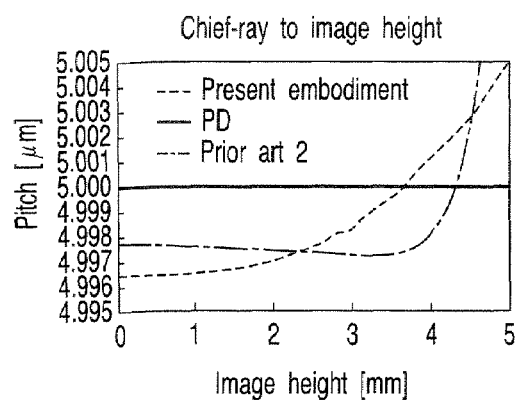
FIGS. 7A and 7B are graphs illustrating comparison between the results shown in FIGS. 5A and 5B and calculated by the optimizing method and those of a prior art (Prior art 2)
Figure 7B:
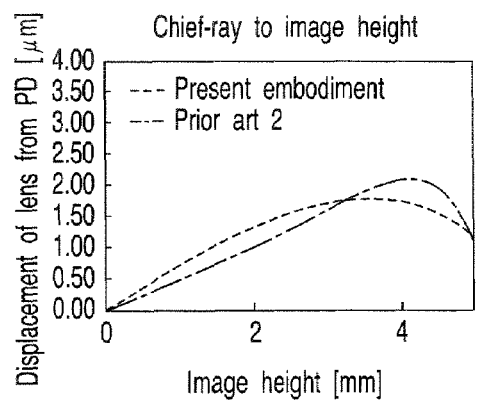

Alternatively, the array pitch in Prior art 2 shown in FIG. 7A is as greater (as 4.998 μm) than the optimum design value of this embodiment where the image height is approximately 0 mm. As the image height increases, the array pitch becomes smaller. As shown in FIG. 7B, the displacement x of the micro-lens from the photodiode in Prior art 2 is smaller by 0.4 μm than the optimum design value of this embodiment where the image height is approximately 2 mm. As the image height increases to about 4 mm, the displacement in Prior art 2 becomes greater by about 0.5 μm than the optimum design value. Finally, when the image height reaches approximately 5 mm, the displacement becomes decreased as close to the optimum design value.

Figure 8:
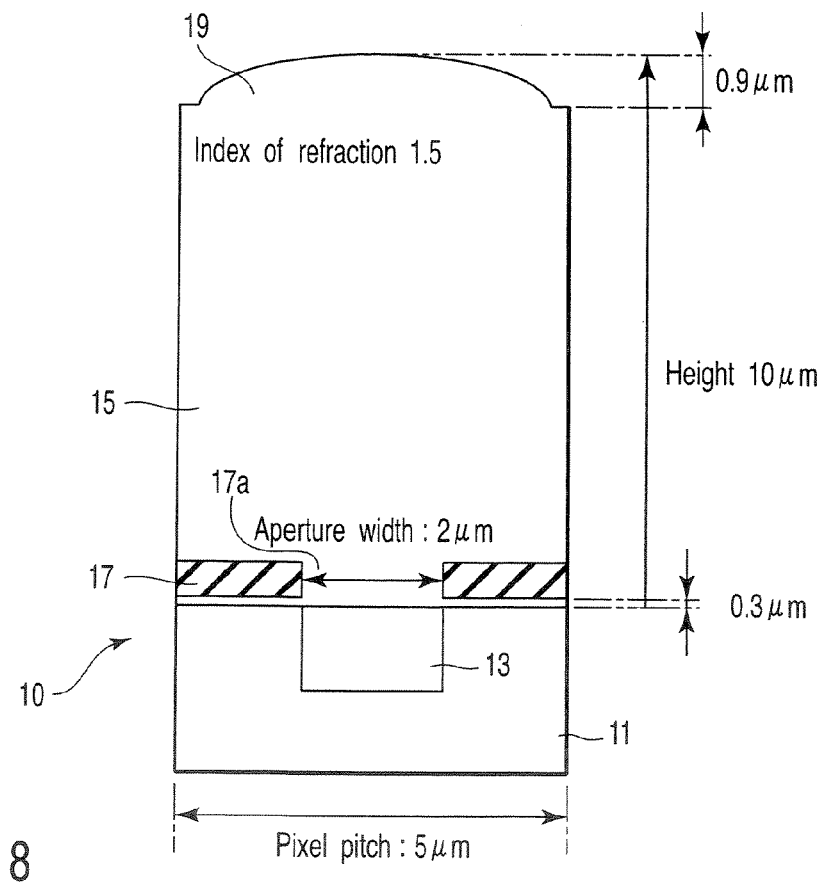
FIG. 8 is a cross sectional view showing an arrangement example of an image sensor for use in sensitivity calculation.

FIG. 8 illustrates an arrangement example of the image sensor 10 used for calculating the photosensitivity. In this case, the photosensitivity of light at 400 nm of the wavelength is measured when the pixel pitch is 5 μm, the height h of the micro-lens 19 including the light transmissive film 15 is 10 μm, the thickness of the micro-lens 19 is 0.9 μm, the width of each aperture 17a in the light shielding film 17 is 2 μm, the height of the light shielding film 17 from the photodiode 13 is 0.3 μm, the index of refraction $\theta_2$ of the micro-lens 19 is 1.5, and the index of refraction $\theta_1$ of air is 1.0. The calculation of the photosensitivity is conduced by using a commercial optical simulator for image sensors (e.g., made of Link Research).

Figure 9:
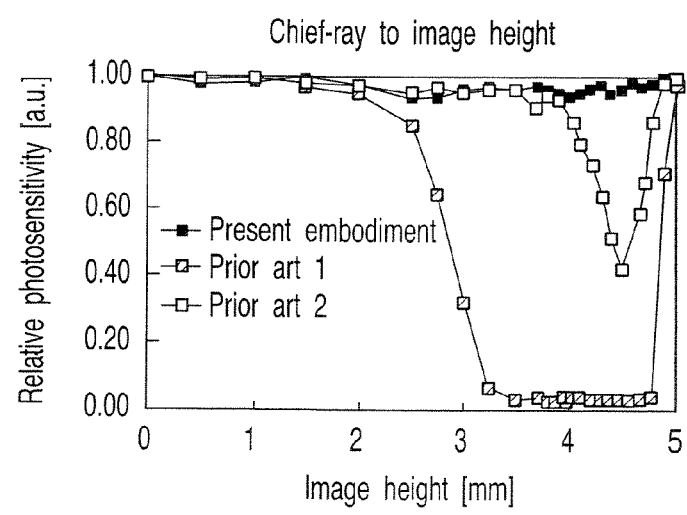
FIG. 9 is a graph illustrating comparison between the results of the sensitivity calculation and those of the prior arts (Prior arts 1 and 2)

FIG. 9 illustrates comparisons in the measurement of the photosensitivity between this embodiment and the prior art (Prior arts 1 and 2). As apparent, the image sensor 10 of this embodiment in which the positional relationship between each micro-lens 19 and its corresponding photodiode 13 is optimized exhibits favorably a constant level of the photosensitivity regardless of the image height.

On the other hand, the measurement of the photosensitivity in Prior art 1 is declined in a range of 3 to 5 mm of the image height. The measurement of the photosensitivity in Prior art 2 is also as low as a half about 4.5 mm of the image height.

As described, this embodiment allows the positional relationship between the micro-lens and its corresponding photodiode to be optimized in the center, the intermediate, and the edge of the imaging area. Accordingly, each photodiode in the imaging area can receive the incident light at a desirable efficiency. More specifically, even if a camera lens is used of which the exit angle of chief-ray from the final plane is increased as the image height increases and then decreased after a particular level of the image height, the photosensitivity on the photodiodes can remain unchanged and uniform regardless of the image height while the correction of shading is properly performed throughout the imaging area.

Second Embodiment

Figure 10A:
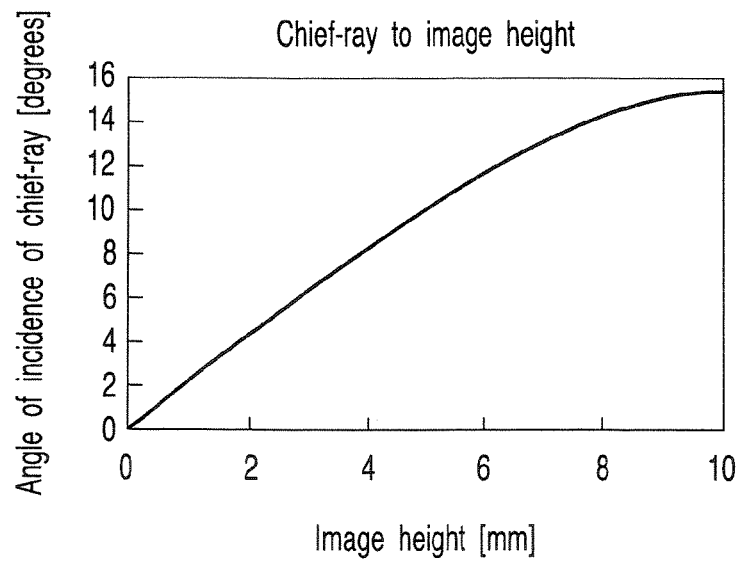
FIGS. 10A and 10B are graphs illustrating a lens characteristic of a camera lens (between the angle of incidence of chief-ray and the image height) and the relationship in array pitch between photodiodes and micro-lenses in case of using the camera lens as an imaging optical system, according to a second embodiment of the present invention.
Figure 10B:
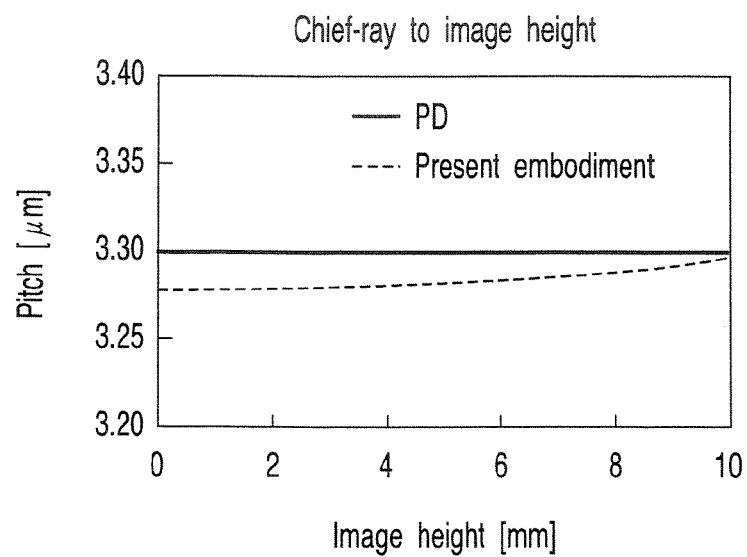

FIGS. 10A and 10B illustrate a lens characteristic of a camera lens and the positional relationship between each micro-lens and its corresponding photodiode in an optical imaging system equipped with the camera lens, according to a second embodiment of the present invention. The camera lens will be described assuming that its angle of incidence of chief-ray is non-linearly increased (at a positive gradation) as the image height changes.

As shown in FIG. 10A, the camera lens according to the second embodiment is differentiated from that of the first embodiment (see, for example, FIG. 3) in that the angle of incidence of chief-ray is non-linearly increased as the image height changes and its gradation is not negative.

The array pitch of the photodiode remains constant at 3.3 μm regardless of the image height, as shown in FIG. 10B. However, the array pitch of the micro-lens is varied depending on the image height. For example, the array pitch is about 3.2 μm, which is smaller than the array pitch of the photodiode, when the image height is 0 mm. Also, the array pitch is about 3.29 μm, which is very close to but bit smaller than the array pitch of the photodiode, when the image height is 10 mm.

Similar to the first embodiment, the second embodiment allows the array pitch of the micro-lens to be modified throughout the imaging area in response to the characteristic of the camera lens (between the angle of incidence of chief-ray and the image height). More specifically, when the camera lens is used of which the exit angle of chief-ray from the final plane is gradually increased before the image height reaches a specific level, the photosensitivity remain unchanged, thus successfully attenuating the undesired effect of shading throughout the imaging area. As each of the photodiodes in the imaging area receives the incident light at higher efficiency, its pixel sensitivity can be improved thus suppressing the effect of shading.

Figure 11:
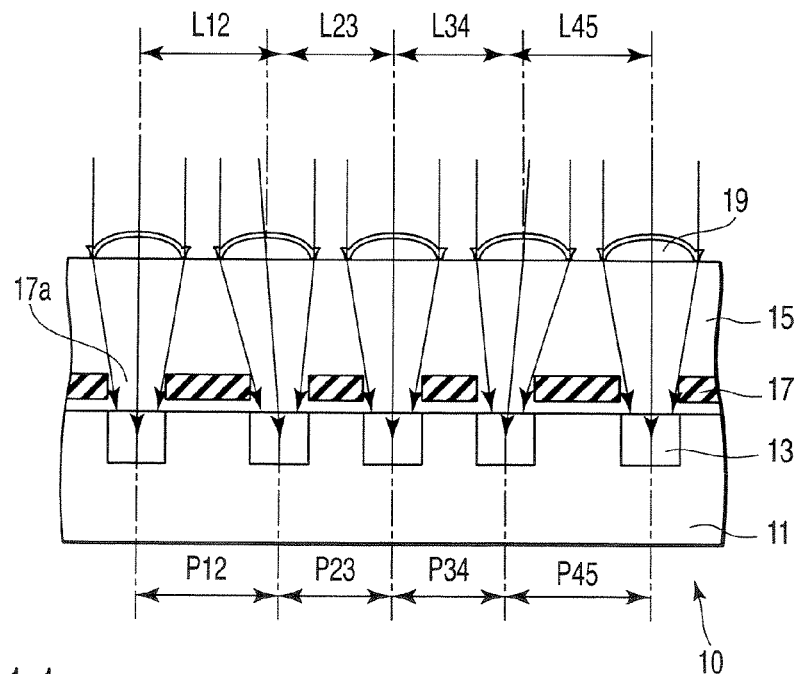
FIG. 11 is a cross sectional view of an arrangement example of a CMOS image sensor according to another embodiment of the present invention.

In both the first and second embodiments, the photodiodes are arranged at equal pitches while the micro-lenses are arranged at varying pitches. The arrangement is not limited to the foregoing arrangement but may be constructed in which the micro-lenses 19 are arranged at equal pitches while the photodiodes 13 are arranged at varying pitches as shown in FIG. 11 (L12=L23=L34=L45 and P12=P45>L12=L23=L34=L45>P23=P34).

Figure 12:
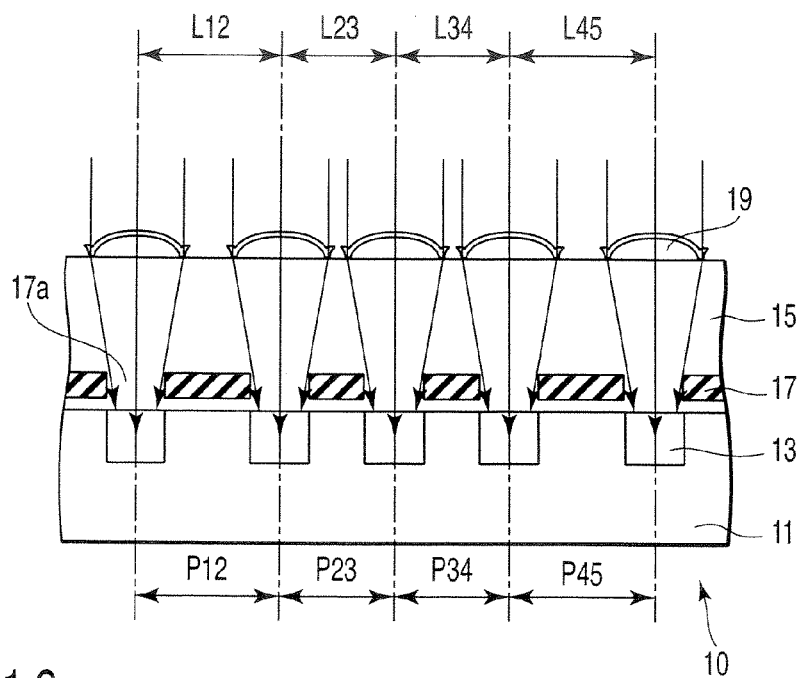
FIG. 12 is a cross sectional view of an arrangement example of a CMOS image sensor according to still another embodiment of the present invention.

Alternatively, all the micro-lenses and the photodiodes are arranged at varying pitches as shown in FIG. 12 (L12=L45>L23=L34, P12=P45>P23=P34, and L12=L45=P12 =P45>L23=L34=P23=P34).

This is not limited to the area sensor but may be a linear sensor, in which the effect of shading can be attenuated with equal success.

Although the micro-lenses are employed for concentration of incident light from a cameral lens, they may be replaced by so-called intra-layer lenses for providing the same advantages. Moreover, a combination of the micro-lenses and the intra-layer lenses can be provided with equal success.

The present invention is applicable to any CCD image sensor as well as the CMOS image sensors. The CMOS image sensors are however greater in the efficacy of advantage than the CCD image sensors since it is wider in the distance between the photodiodes and the micro-lenses.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A solid-state imaging device comprising:
a plurality of photo receivers arranged in a two-dimensional array on a semiconductor substrate, the photo receivers receiving exit light from an imaging optical system; and
a plurality of condensing lenses arranged over said plurality of photo receivers, respectively,
wherein:
said plurality of photo receivers are arranged at equal pitches;
said plurality of condensing lenses are arranged at smaller pitches than said plurality of photo receivers in a region where an image height is zero;
said plurality of condensing lenses are arranged at greater pitches in a region where the image height is larger than zero than in the region where the image height is zero; and
said plurality of condensing lenses are arranged at smaller pitches than said plurality of photo receivers in a central part of an image area, and said plurality of condensing lenses are arranged at greater pitches than said plurality of photo receivers around the image area.

2. The solid-state imaging device according to claim 1, wherein said plurality of condensing lenses are arranged depending on a displacement amount between a position of each condensing lens where the exit light from the imaging optical system is incident and a position of its corresponding photo receiver where the exit light from the imaging optical system is incident, the displacement amount being calculated from the dependency on an image height of an angle of transmittance of the light emitted from the imaging optical system.

3. The solid-state imaging device according to claim 1, wherein the image optical system has a lens characteristic deviated from paraxial ray approximation such that an angle of incidence of chief-ray is increased as the image height becomes high and then, the angle of incidence of chief-ray is decreased.

4. A camera apparatus comprising:
a solid-state imaging device including a plurality of photo receivers arranged in a two-dimensional array on a semiconductor substrate and a plurality of condensing lenses arranged over said plurality of photo receivers, respectively; and
an imaging optical system which emits incident light received on said plurality of photo receivers via said plurality of condensing lenses, respectively,
wherein:
said plurality of photo receivers are arranged at equal pitches;

said plurality of condensing lenses are arranged at smaller pitches than said plurality of photo receivers in a region where an image height is zero;

said plurality of condensing lenses are arranged at greater pitches in a region where the image height is larger than zero than in the region where the image height is zero; and said plurality of condensing lenses are arranged at smaller pitches than said plurality of photo receivers in a central part of an image area, and said plurality of condensing lenses are arranged at greater pitches than said plurality of photo receivers around the image area.

5. The camera apparatus according to claim 4, wherein said plurality of condensing lenses are arranged depending on a displacement amount between a position of each condensing lens where the exit light from the imaging optical system is incident and a position of its corresponding photo receiver where the exit light from the imaging optical system is incident, the displacement amount being calculated from the dependency on an image height of an angle of transmittance of the light emitted from the imaging optical system.

6. The camera apparatus according to claim 4, wherein the image optical system has a lens characteristic deviated from paraxial ray approximation such that an angle of incidence of chief-ray is increased as the image height becomes high and then, the angle of incidence of chief-ray is decreased.

7. The camera apparatus according to claim 6, wherein the angle of incidence of chief-ray of the imaging optical system has a maximum value in a region except where the image height is 100%.

* * * * *